United States Patent
Schwartz et al.

(10) Patent No.: US 9,389,511 B2
(45) Date of Patent: Jul. 12, 2016

(54) METHODS OF MAKING PATTERNED STRUCTURES OF MATERIALS, PATTERNED STRUCTURES OF MATERIALS, AND METHODS OF USING SAME

(75) Inventors: Evan L. Schwartz, Vadnais Heights, MN (US); Wei Min Chan, Ithaca, NY (US); Jin-Kyun Lee, Incheon (KR); Sandip Tiwari, Ithaca, NY (US); Christopher K. Ober, Ithaca, NY (US)

(73) Assignee: Cornell University, Ithaca, NY (US)

( * ) Notice: Subject to any disclaimer, the term of this patent is extended or adjusted under 35 U.S.C. 154(b) by 41 days.

(21) Appl. No.: 14/005,964

(22) PCT Filed: Mar. 19, 2012

(86) PCT No.: PCT/US2012/029653
§ 371 (c)(1),
(2), (4) Date: Apr. 2, 2014

(87) PCT Pub. No.: WO2012/129162
PCT Pub. Date: Sep. 27, 2012

(65) Prior Publication Data
US 2014/0205818 A1    Jul. 24, 2014

Related U.S. Application Data

(60) Provisional application No. 61/454,015, filed on Mar. 18, 2011.

(51) Int. Cl.
G03F 7/26     (2006.01)
G03F 7/16     (2006.01)
H01L 21/027   (2006.01)
B81C 1/00     (2006.01)
G03F 7/038    (2006.01)
G03F 7/00     (2006.01)

(52) U.S. Cl.
CPC .............. G03F 7/16 (2013.01); B81C 1/00031 (2013.01); G03F 7/038 (2013.01); H01L 21/027 (2013.01); *B81C 2201/0149* (2013.01); *G03F 7/0002* (2013.01); *Y10T 428/24851* (2015.01)

(58) Field of Classification Search
CPC ....................................................... G03F 7/0015
See application file for complete search history.

(56) References Cited

U.S. PATENT DOCUMENTS

| 2009/0011141 | A1  | 1/2009  | Carter et al. |
| 2010/0167214 | A1* | 7/2010  | Yoon et al. ............... 430/323 |
| 2010/0289019 | A1  | 11/2010 | Katz et al. |
| 2011/0147983 | A1* | 6/2011  | Cheng et al. ............. 264/220 |

FOREIGN PATENT DOCUMENTS

WO    2009143357  A2    11/2009

OTHER PUBLICATIONS

Dhar et al., Field-effect-tuned lateral organic diodes, PNAS, Mar. 2, 2010, vol. 107, No. 9, 3972-3976.

* cited by examiner

*Primary Examiner* — Kathleen Duda
(74) *Attorney, Agent, or Firm* — Hodgson Russ LLP

(57) ABSTRACT

A method for forming patterns of organic polymer materials. The method can be used to form a layer with two patterned organic polymer materials. The photoresist and solvents used in the photoresist deposition and removal steps do not substantially affect the organic polymer materials.

14 Claims, 9 Drawing Sheets

US 9,389,511 B2

METHODS OF MAKING PATTERNED STRUCTURES OF MATERIALS, PATTERNED STRUCTURES OF MATERIALS, AND METHODS OF USING SAME

CROSS-REFERENCE TO RELATED APPLICATIONS

This application claims priority to U.S. provisional patent application No. 61/454,015, filed Mar. 18, 2011, the disclosure of which is incorporated herein by reference.

STATEMENT REGARDING FEDERALLY SPONSORED RESEARCH

This invention was made with government support under grant number FA9550-09-1-0705 awarded by the Air Force Office of Scientific Research (AFOSR) MURI Program on new graphene materials technology. The United States Government has certain rights in the invention.

FIELD OF THE INVENTION

The present invention generally relates to methods of patterning materials. More particularly, the methods relate to patterning using a combination of additive and subtractive patterning steps (CASP).

BACKGROUND OF THE INVENTION

There are multiple ways to deposit functional polymer films. Spin coating has been used extensively in the field of electronics for its ability to spread solution-processable materials in smooth films over large areas. In most polymer deposition processes, liquid solvents are used in order to enhance the processability of the materials and simplify their handling. Typically, one kind of material is deposited per coat, usually on an atomically flat substrate, such as silicon. During the spin-coating process, the solvent is quickly removed via centrifugal forces to leave behind a film having a desired thickness, which can be further dried with a brief bake step. If a particular application requires a stack of two different polymers, (e.g., Polymer B on top of Polymer A), attention must be paid to the interaction of Solvent B with the dry film of Polymer A. If Solvent B is miscible with Polymer A, the result is usually a significant amount of swelling, intermixing or damage to the film of Polymer A that may be undesirable for many applications.

As the field of high-resolution patterning progresses towards the molecular realm, alternative patterning techniques offer cost-attractive process options to expensive lithography tools. Of these methods, the self-assembly of block copolymers is a method for extending lithographic patterning into the sub-20 nm size regime.

The block copolymer community has been limited to the use of only one block copolymer per layer due to the damage and intermixing caused by the spin coating of another block copolymer solution on top of a previously deposited copolymer film. The limitation of only one self-assembled block copolymer domain size and pitch is not attractive to the lithography community, which has grown used to the ability to print patterns of arbitrary shapes and sizes using photolithography.

BRIEF SUMMARY OF THE INVENTION

The present invention provides methods for forming a layer (or layers) on a substrate where each layer comprises a plurality of (e.g., two or three) patterned organic polymer materials. The patterns of the materials are complementary. The methods use an orthogonal photoresist to form a layer without substantially affecting the organic polymer materials. The present invention also provides a layer (or layers) on a substrate where each layer comprises a plurality of (e.g., two or three) patterned organic polymer materials, and devices (e.g., a light emitting display (LED)) comprising such a layer or layers.

The organic polymer materials can be block copolymers. For example, the method can be used to form a layer comprising two or more different patterned block copolymers.

DETAILED DESCRIPTION OF THE INVENTION

The present invention provides methods for providing patterned organic structures on a substrate and uses of such materials. The present invention also provides patterned structures of organic polymer materials. For example, multiple iterations of subtractive and additive patterning can be used to deposit different polymer films in the same layer.

The instant invention provides a process that uses orthogonal processing of polymer films and a combination of additive and subtractive patterning. For example, two block copolymers with different self-assembled domain sizes and pitches can be deposited adjacent to one another on the same layer of a silicon wafer surface. The CASP approach minimizes solvent interactions between successive layers (e.g., spin coated materials). In addition to block copolymers, this approach could be extended to the patterning of multiple functional polymers on the same layer for many other applications in electronics, biology or beyond.

The methods of the present invention address the problem of intermixing of polymer materials by, for example, protecting the top surface of the first block copolymer film with a non-interacting semi-fluorinated photoresist coating. The lithographic process steps of patterning, developing and stripping of the resist can all be accomplished with semi-fluorinated solvents that do not interact with the underlying block copolymer film.

Figure 1:
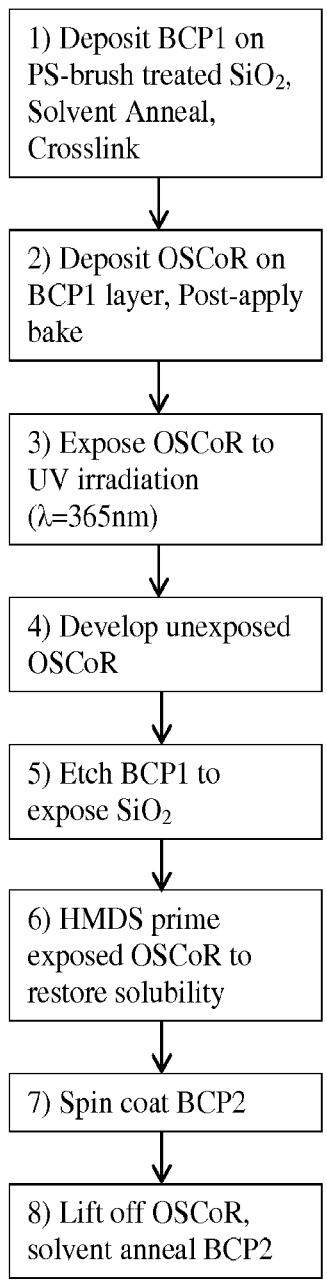
FIG. 1. An flowchart of an example of a CASP process.
Figure 2:
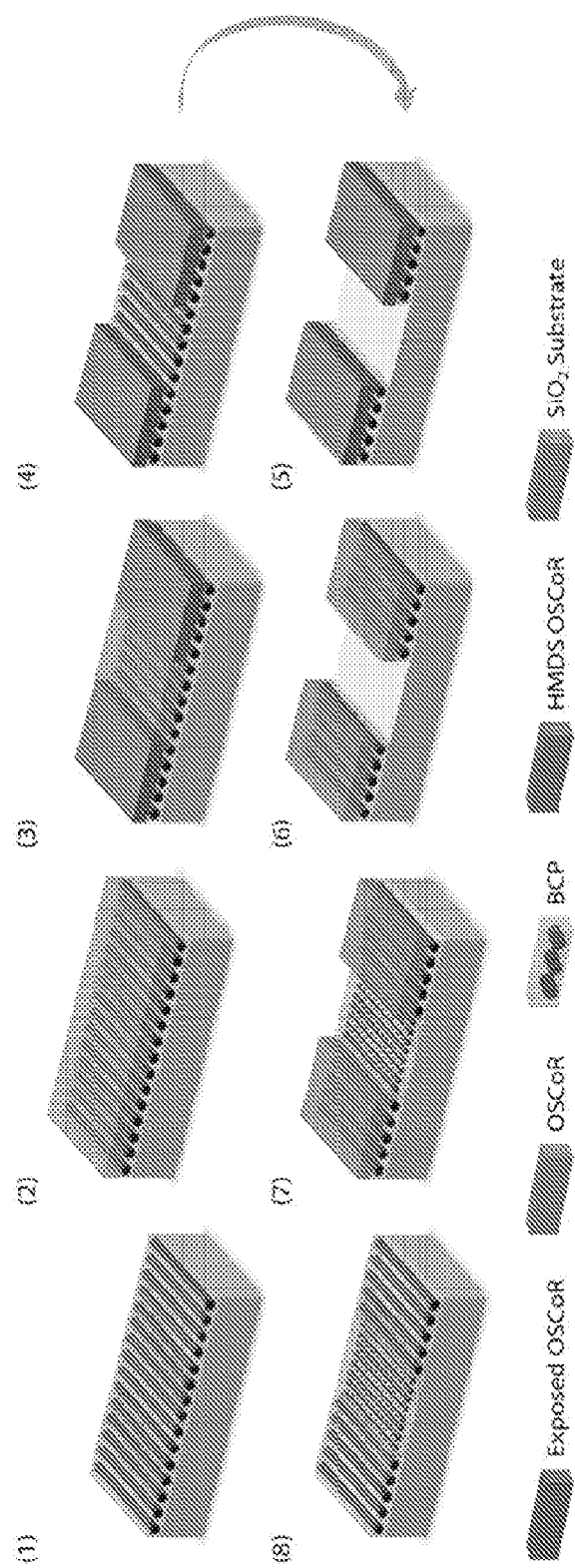
FIG. 2. An example of a CASP process flow. 1) Deposit first block copolymer (BCP1), solvent anneal, crosslink 2) Deposit semi-fluorinated resist (OSCoR) on BCP1 3) Expose OSCoR to ultraviolet irradiation ($\lambda$=365 nm), 4) Develop and remove unexposed OSCoR with fluorous solvent, 5) Etch underlying BCP1 with $O_2$ plasma to expose $SiO_2$ substrate, 6) Hexamethyldisilazane (HMDS) vapor prime to restore OSCoR solubility to previously exposed regions, 7) Spin coat second block copolymer (BCP2), 8) Lift off OSCoR, solvent anneal BCP2.
Figure 10:
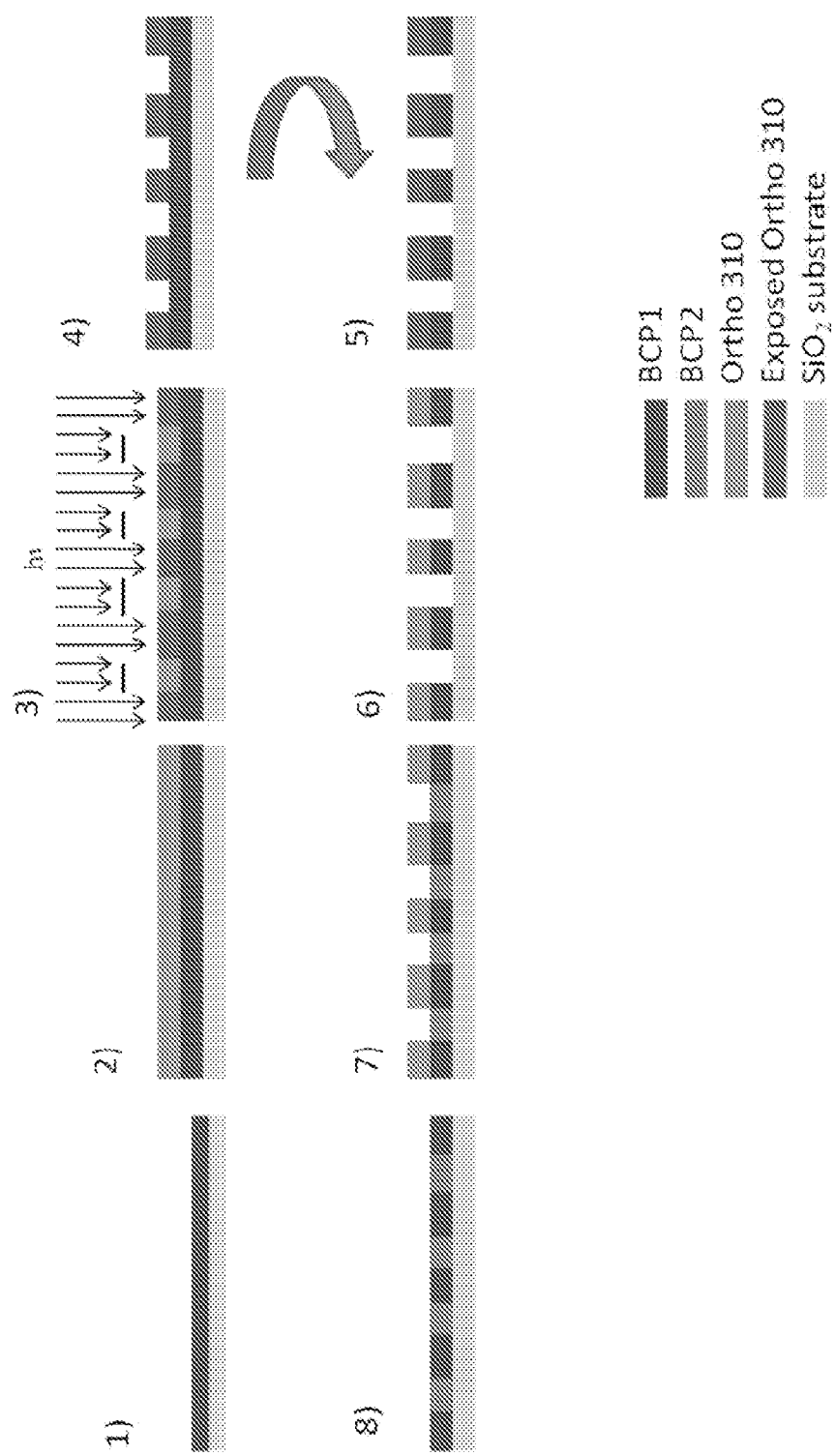
FIG. 10. Schematic of the lithographic patterning of P(FDMA-ran-TBMA).

For example, the methods can use "orthogonal processing", which allows creation of overlaying stacks of functional light-emitting materials with desirable fidelity, performance, and stability. "Orthogonal processing" avoids the intermixing problem by, for example, substituting a semifluorinated photoresist and solvent system in for the hydroxylic solvent-based photoresists traditionally used in lithographic processing. The technique allows for spin coating of functional semifluorinated materials on top of hydroxylic-based functional materials (and vice versa) with little to no intermixing between the layers. Multiple block copolymers, with different sizes and pitches, adjacent to each other on the same layer can be deposited. The process, shown in FIGS. 1, 2 and 10, uses a combination of additive and subtractive patterning approaches (CASP) which may also be applicable to other functional polymer systems.

The present invention can use orthogonal processing that allows for the deposition of two or more different polymers adjacent to each other on the same layer. In an embodiment, two different block copolymers, which self-assemble at different length scales corresponding to their respective molecular weight, can be used. For example, the two different block copolymers can have self-assembled features on the scale of ~50 nm and ~20 nm, respectively, which can be used to verify the adjacent placement of the two different polymers using a microscopy technique capable of such resolution, such as atomic force microscopy. The methods, as shown in exemplary process schematics (FIGS. 1, 2 and 10), can use a combination of additive and subtractive patterning approaches (CASP). For example, using this process, the top of the first crosslinked block copolymer (BCP1) is protected with a non-interacting fluorinated photoresist, which can be used to create patterned gaps in the BCP1 layer following photolithography and oxygen plasma reactive ion etching. A second block copolymer (BCP2) can be spin coated in these gaps, and then the photoresist can be cleanly removed. This process may also be applicable to other solution-processable functional materials which require accurate lateral placement without the damage or intermixing caused by the solvent used for processing. Depending on the substrate and organic polymer materials used, it is possible that the first block copolymer must be crosslinked to avoid lift-off during the spin coating of the second block copolymer. For example, a PαMS-b-PHOST copolymer can be used as a photochemically crosslinkable first organic polymer material. The CASP process minimizes swelling and distortion of the crosslinked polymer that can be caused by exposure to solvent.

The methods of the present invention allows, for example, spin-coating of multiple polymer films on the same wafer layer. Using an orthogonal processing approach, a semi-fluorinated photoresist/solvent system can be spin-coated on top of many organic polymer films without any swelling or intermixing. Following lithographic patterning of the semi-fluorinated photoresist and subtractive etching through the first polymer film, a second polymer can be additively spin-coated in the exposed areas of the substrate. Finally, the fluorinated photoresist layer can be cleanly removed without damaging the two underlying polymer films. For example, two block copolymers with different self-assembled domain sizes and pitches were deposited using a combined additive and subtractive patterning (CASP) technique. Multiple sizes and pitches of self-assembled features enable greater process complexity for future block copolymer lithography. The approach can be extended to other applications requiring adjacent placement of micro-patterned solution-processable materials, such as for organic integrated circuitry.

In an aspect, the present invention provides methods for forming one or more layers of organic polymer materials on a substrate. Each layer has a plurality of patterned structures of two or more organic polymer materials. These patterns of organic polymer material are complementary and can together form a continuous layer. For example, each layer has a plurality of patterned structures of a first organic polymer material and a plurality of patterned structures of a second organic polymer material.

Using the methods of the present invention, the only contact area between two adjacent layers of organic polymer material occurs at the cross-section (i.e., interface) of a subtractively patterned layer of organic polymer material. The two layers of organic polymer material can come into contact only at this interface to create a continuous film without any gaps.

The invention can be used to deposit multiple polymers adjacent to each other on the same layer of substrate. It may be used for block copolymers to enable different morphologies, or pitches to be spin coated on the same layer. Also, the invention may be used to place, for example, red, green and blue light-emitting polymer "pixels" next to each other for organic light emitting diode displays, or other electronically active solution-processable molecules for integrated organic circuitry.

In an embodiment, the method of forming a layer of patterned organic polymer materials on a substrate comprises the steps of: forming a layer of an organic polymer material on a substrate; selectively exposing portions of the substrate using an orthogonal photoresist; selectively forming a layer of an organic polymer material on the exposed portion of the substrate; and, optionally, repeating the steps of selectively exposing portions of the substrate using an orthogonal photoresist; selectively forming a layer of an organic polymer material on the exposed portion of the substrate. Each added organic polymer material in the selectively forming a layer of an organic polymer material on the exposed portion of the substrate step is different from the organic polymer material or polymer materials already formed on the substrate. In another embodiment, the method further comprises forming one or more patterned organic polymer materials layers on the organic polymer materials layer formed after the selectively exposing portions of the substrate using an orthogonal photoresist and selectively forming a layer of an organic polymer material on the exposed portion of the substrate steps by alternating steps of selectively forming a layer of an organic polymer material using an orthogonal photoresist and adding an organic polymer material to the space created by the selective removal.

In an embodiment, the method comprises the steps of depositing a first organic polymer material on at least a portion of a substrate; depositing orthogonal photoresist on the first organic polymer material; patterning the photoresist, such that an exposed portion of first organic polymer material and an unexposed portion of first organic polymer material are formed where the exposed portion of first organic polymer material is not covered by a layer of photoresist and the unexposed portion of first organic polymer material is covered by the photoresist; removing the exposed portion of first organic polymer material, such that corresponding patterned layers of first organic polymer material and photoresist, and a revealed portion of the substrate corresponding to the unexposed portion of first organic polymer material, are formed; depositing a second organic polymer material on the patterned photoresist and revealed portion of the substrate; and contacting the substrate and layers from the previous step with a solvent, such that the patterned photoresist and portion of second organic polymer material corresponding to the patterned photoresist are removed. These steps form a layer comprising a plurality of patterned structures of a first organic polymer material and a plurality of patterned structures of a second organic polymer material.

The steps of the method can be repeated to form a layer having more than two materials. In an embodiment, the following steps can be in added to the previous embodiment: depositing photoresist on layer of patterned material on at least a portion of the layer comprising a plurality of patterned structures of a first organic polymer material and a plurality of patterned structures of a second organic polymer material from the previous embodiment; patterning the photoresist, such that an exposed portion of the layer of patterned material and an unexposed portion of the layer or patterned material are formed, where the exposed portion of the layer of patterned material is not covered by a layer of photoresist and the unexposed portion of the layer of patterned material is covered by the photoresist; removing the exposed portion of the layer of patterned material, such that corresponding patterned layer of patterned material and photoresist and a revealed portion of the substrate corresponding to the unexposed portion of first organic polymer material, are formed; depositing organic polymer material other than the organic polymer materials in the layer of patterned material; and contacting substrate and layers from the previous step with a solvent, such that the patterned photoresist and portion of organic polymer material other than the organic polymer materials in the layer of patterned material corresponding to the patterned photoresist are removed, where a layer comprising a plurality of patterned structures of the organic polymer material other than the organic polymer materials in the layer of patterned material and patterned structures of the organic polymer materials in the layer of patterned organic polymer material are formed.

The steps of the method can be repeated so that multiple layers of materials can be formed. The layers can have the same materials, different materials, or a combination of materials from different layers. In an embodiment, the steps can be repeated from 1 to 10 times, including all ranges and individual repeat numbers therebetween.

The steps of the method described in the various embodiments and examples disclosed herein are sufficient to form the layer or layers of the present invention. Thus, in an embodiment, the method consists essentially of a combination of the steps of the method disclosed herein. In another embodiment, the method consists of such steps.

In an embodiment, the present invention provides a layer or layers of patterned structures of two or more organic polymer materials on substrate made by the methods of the present invention. The patterned structures form a continuous layer or layers. For example, the layer or layers have a pattern of structures of a first organic polymer material and a pattern of structures of a second organic polymer material in the same layer.

Any substrate on which the various layers can be formed can be used. A wide range of substrate materials, sizes, and shapes can be used. For example, substrates suitable for use in semiconductor processing equipment (e.g., 25 mm, 100 mm, 150 mm, 200 mm, and 300 mm diameter wafers) can be used. Also, a foil substrate (e.g., aluminum foil) or flexible substrates (e.g., polyimide) can be used. A wide variety of substrate materials can be used. For example, inorganic, metal and organic polymer substrates can be used. Examples of suitable inorganic substrate materials include, but are not limited to, silicon, silicon oxide, silicon nitride, gallium arsenide, glass, quartz, and sapphire). Examples of suitable metal substrates include, but are not limited to, steel and aluminum. Examples of suitable polymer substrates include, but are not limited to, polyethylene terephthalate, PET), polyethylene naphthalate, PEN), triacetyl cellulose (TAC), polycarbonate, polyimide. Substrates with multiple materials (e.g., multiple layers of materials such as silicon/silicon nitride substrates) can be used.

The substrate can be coated with a primer layer of material that improves the deposition of the first layer of organic polymer material. The primer material can be a polymer or a small molecule such as an adhesion promoter (e.g., glycidoxypropyltrimethylsilane). For example, in the case of a silicon wafer, a layer of polymer material or small molecules can be deposited on the wafer. It is desirable the polymer material be chemically bonded (e.g., covalently bonded) to the substrate. Accordingly, the primer layer material can have functional moieties that can react with and chemically bond to the substrate. Examples of suitable functional moieties include, but are not limited to, hydroxyl, amide esters, urethanes, isocyanates, vinyl ethers, epoxy groups, and styryl groups. The primer material can be a polymer having one or more such functional moieties. The primer material can covalently interact (e.g., form a covalent bond) or not covalently interact with the organic polymer material.

In the case where the organic polymers are block copolymers, the substrate can be coated with a layer of a primer material that is an orienting material that increases the mobility of the block copolymer segments during an annealing step. Without intending to be bound by any particular theory, it is considered the mobility of the segments results from a reduction in substrate pinning. For block copolymer organic materials, it can be advantageous for the primer material not to covalently interact with the block copolymer. For example, if it is desirable to maintain the morphology of the block copolymer, the primer material should not covalently interact with the organic polymer material. Accordingly, in one embodiment, the primer material has only one functional moiety that can react with and covalently bond to the substrate (e.g., hydroxyl-terminated polystyrene). An example of a suitable orienting material is hydroxyl-terminated polystyrene, which can be covalently bound to a silicon substrate to form a 2-5 nm polymer "brush." Random copolymers can also be used to control the orientation of the resulting block copolymer deposited (e.g., spin coated) on the substrate, by methods known in the art.

The various layers can be deposited by a variety of methods known in the art. Examples of suitable deposition methods include, but are not limited to, spin coating, dip coating, flow coating, slot coating, slide coating, inkjet printing, microcontact printing or other imprint-based deposition, screen printing, gravure (flexographic) printing, sputtering, evaporation (e.g., for deposition of small molecules), electrodeposition, atomic layer deposition, spray-coating, knife coating, and doctor blade coating.

A variety of organic polymer materials (also referred to herein as solution processible materials and materials) can be used. Any organic polymer material that can be patterned using the methods of the present invention can be used. Such organic polymers are commercially available or can be synthesized. The layer of organic polymer material can be of any thickness that can be patterned using the methods described herein. For example, the thickness of the organic polymer layers can be from 5 nm to 10 microns, including all values to the nm and ranges therebetween.

For example, the organic polymer materials can be block copolymers. Block copolymers with different molecular weight, and therefore different self-assembled domain sizes and pitches, can be used to form multiple, different self-assembled domain sizes and pitches on the substrates (e.g., a silicon wafer surface).

The block copolymers may be processed in such a way that one block is removed to create a periodic nanoporous template. For example, the remaining polymer may be used as an etch mask in which to transfer the self-assembled pattern into the substrate using etching techniques known in the art. As another example, metal may be deposited in the pores of the template, and the organic polymer lifted off to create multiple length scale features on the nanometer scale.

Examples of suitable block copolymers include, but are not limited to, polystyrene-block-poly(acrylic acid), polystyrene-block-polyferrocenylsilane, polystyrene-block-polymethylmethacrylate, polystyrene-block-polydimethylsiloxane, poly(styrene)-block-poly(ethylene glycol), poly(ethylene glycol)-block-poly(propylene glycol)-block-poly(ethylene glycol), polyethylene-block-poly(ethylene glycol), poly(propylene glycol)-block-poly(ethylene glycol)-block-poly(propylene glycol), polystyrene-block-polybutadiene-block-polystyrene styrene, polystyrene-block-poly(ethylene-ran-butylene)-block-polystyrene Polystyrene-block-polyisoprene-block-polystyrene styrene, polystyrene-block-polybutadiene, polystyrene-block-poly(2-vinyl pyridine), polystyrene-block-poly(4-vinyl pyridine), polybutadiene-block-polyethylene oxide, polyacrylonitrile-block-polystyrene, polystyrene-block-poly(lactic acid).

For example, poly(alpha-methylstyrene)-block-polyhydroxystyrene having the following structure can be used.

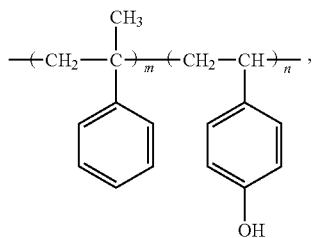

where m is from 10 to 1000, including all ranges and integer values therebetween, and n is from 10 to 1000, including all ranges and integer values therebetween.

For example, block copolymers having one or more of the following blocks can be used: polybutadiene, polyisoprene, poly(methyl methacrylate), polystyrene, poly(ethylene oxide), polyethylene, poly(4-vinylpyridine), poly(4-hydroxystyrene), poly(4-tert-butoxystyrene), poly(acrylic acid), poly(vinyl acetate), poly(tert-butyl methacrylate), poly(vinyl alcohol), poly(alpha-methylstyrene), poly(2-vinyl naphthalene), poly(caprolactone), poly(isobutylene), poly(n-butyl methacrylate), poly(n-butyl acrylate), poly(hydroxylethyl acrylate), polyacrylonitrile, and poly(lactic acid).

In an embodiment, block copolymer comprising one or more permanent blocks and one or more sacrificial blocks can be used. The sacrificial blocks can be removed from the patterned structures by, for example, thermal treatment or exposure to electromagnetic (e.g., ultraviolet) radiation. The permanent blocks remain after removal of the sacrificial blocks. The remaining permanent blocks form a sub-pattern based on the original pattern of block co-polymer material. Examples of suitable permanent blocks include, but are not limited to, polystyrene, poly(4-vinyl pyridine), polyferrocenylsilane, polydimethylsiloxane, polyhydroxystyrene, poly(4-vinylphenol), poly(tert-butyl methacrylate), and poly(acrylic acid). The permanent blocks can have photocrosslinkable units. Examples of suitable photocrosslinkable units include cinnamate, chalcone (e.g., benzylidene acetophenone), cynnnamelidene acetate (e.g., styrylacrylate), p-phenylene diacrylic ester, styryl pyridinium, coumarin, diacetylene, and maleimide moieties. Examples of suitable sacrificial blocks include, but are not limited to, poly(methyl methacrylate) (PMMA), poly(butadiene), poly(isoprene), poly(alpha-methylstyrene), poly(propylene carbonate), poly(L-lactide), poly(ethylene oxide), polystyrene, and poly(perfluorooctylethyl methacrylate).

It is desirable that the organic polymer material used in the first layer of organic polymer material be cross-linked. It is considered that cross-linking limits the effect of subsequent process steps on the first layer. A variety of cross-linking methods known in the art can be used. Examples of suitable cross-linking methods include, but are not limited to, UV irradiation initiated, electron beam initiated, gamma-ray initiated, thermal initiated, and acid catalyzed. Various cross-linking chemistries can be used. For example, peroxide-based chemistries, vulcanization, and free-radical chemistries can be used.

In an embodiment, the first layer of organic polymer material comprises a cross-linking compound. Examples of suitable cross-linking compounds include, but are not limited to tetramethoxymethylglycouril (TMMGU), bis(2-methacryloyl)oxyethyl disulfide, 1,4-bis(4-vinylphenoxy)butane, divinylbenzene, p-divinylbenzene, glycerol ethoxylate (e.g., average $M_n$ ~1,000), glycerol ethoxylate-co-propoxylate triol, hexa(ethylene glycol)dithiol, (hydroxymethyl) melamine, methylated/isobutylated/carboxylated pentaerythritol ethoxylate (3/4 EO/OH), pentaerythritol propoxylate/ethoxylate, pentaerythritol propoxylate (5/4 PO/OH), 1,4-phenylenediacryloyl chloride, polycarbodiimide, 1,3,5-triallyl-1,3,5-triazine-2,4,6(1H,3H,5H)-trione, trimethylolpropane ethoxylate, trimethylolpropane propoxylate, tris[2-(3-mercaptopropionyloxy)ethyl]isocyanurate, and 4-vinylbenzocyclobutene. The cross-linking agent can be added to the polymer composition as a solid, liquid, or solution.

In an embodiment, the first layer of organic polymer material comprises a photoacid generator (PAG). Examples of suitable photoacid generators include, but are not limited to, triphenyl sulfonium triflate (TPST), N-hydroxynaphthalimide perfluorobuylsulfonate, N-nonafluoropropane-sulfonyloxy-1,8-napthalimide, N-nonafluoroethane-sulfonyloxy-1, 8-naphthalimide, N-nonafluoromethane-sulfonyloxy-1,8-naphthalimide, triarylsulfonium perfluoroalkanesulfonates (such as triphenylsulfonium perfluorooctanesulfonate, triphenylsulfonium perfluorobutanesulfonate, and triphenylsulfonium trifluoromethanesulfonate), triarylsulfonium hexafluorophosphates (or hexafluoroantimonates) (such as triphenylsulfonium hexafluorophosphate and triphenylsulfonium hexafluoroantimonate), triaryliodonium perfluroalkanesulfonates (such as diphenyliodonium perfluorooctanesulfonate, diphenyliodonium perflurobutanesulfonate diphenyliodonium trifluoromethanesulfonate, di-(4-tert-butyl)phenyliodonium, perfluoroctanesulfonate, di-(4-tert-buyl)phenyliodonium perflurobutanesulfonate, di-(4-tert-butyl)phenyliodonium trifluoromethanesulfonate), triaryliodonium hexafluorophosphates (or hexafluoroantimonates) (such as diphenyliodonium hexafluorophosphate, diphenyliodonium hexafluoroantimonate, di-(4-tert-butyl) phenyliodonium hexafluorophosphate, di-(4-tert-butyl)phenyliodonium hexafluoroantimonate, norbornene-based ionic PAGs (photoacid generators) (such as n-hydroxy-5-norbornene-2,3-dicarboximide perfluorooctanesulfonate, n-hydroxy-5-norbornene-2,3 dicarboximide perflurobutanesulfonate, n-hydroxy-5-norbornene-2,3 dicarboximide trifluoromethanesulfonate), napthalene-based non-ionic PAGs (such as n-hydroxynaphthalimide perflurooctanesulfonate and n-hydroxynapthalimide perfluorobutanesulfonate, and n-hydroxynapthalimide trifluoromethanesulfonate). Combinations of PAGs can be used.

When block copolymers are used as the organic polymer material, after deposition of the block copolymer material the material can be annealed, for example, to improve the ordering properties. Examples of annealing methods include, but are not limited to, thermal annealing, thermal-zone annealing, solvent-vapor annealing, graphoepitaxy, shear alignment, electric field, magnetic field, thermal annealing (e.g., heating at or above polymers glass transition temperature but below polymer decomposition temperature), and solvent annealing (e.g., solvent must plasticize one or more block of the block copolymer). As a result of the annealing process, the block co-polymer can exhibit ordered microdomains. The observed microdomains can be effected by changing the volume fraction of one polymer "block" relative to the other, usually during the polymer synthesis by changing the molecular weight of the block copolymer. Examples of microdomains include, but are not limited to, spheres, cylinders, lamellae gyroid, bicontinuous "double diamond", and inverted microstructures. In the case of triblock copolymers, annealing can result in combinations of microstructures. For example, the size of the microdomains can be from 10 nm to 50 nm, including all values to the nm and ranges therebetween.

For some combinations of materials it is desirable to deposit a solubilizing agent on the substrate and other materials on the substrate (e.g., after removal of the first organic polymer material). Examples of suitable solubilizing agents (depending on the materials used) include, but are not limited to, hexamethyldisilazane (HMDS), heptamethyldisilazane, 1,1,3,3-tetramethyldisilazane, and IPA (isopropanol). In an embodiment, silylation treatment is used after the subtractive patterning steps blocks to alter the adhesion of the second organic polymer material onto the top of the photoresist layer (e.g., a fluorinated resist, but does not completely resist the adhesion of second organic polymer material to the substrate, enabling selective area deposition of the second organic polymer material).

A variety of photoresist materials and can be used. The photoresist is an orthogonal photoresist. The orthogonal photoresist can be used to selectively expose portions of the substrate (and patterning the underlying layer of organic polymer material) by depositing the photoresist on at least a portion of the layer organic polymer material, patterning the photoresist, and removing the organic polymer material (e.g., by an etch process).

By orthogonal photoresist it is meant the photoresist and photoresist deposition/removal proceses (e.g., use of deposition/removal solvent(s)) do not substantially interact with the already deposited materials (e.g., organic polymer materials). The photoresist/solvent(s) do not intermix (e.g., have low solubility) with the already deposited materials (e.g., organic polymer materials), causes little if no change in the film dimensions (e.g., film thickness or lateral film dimension (if applicable), or dimension of a microdomain) of the already deposited materials, causes little if any cracking or delamination of the already deposited materials. Low solubility is 5% or less by weight solubility of an already deposited material (e.g., organic polymer material) in the deposition solvent(s) used in the photoresist deposition process. In various examples, the solubility of an already deposited material is less than 4%, 3%, 2%, or 1% by weight. In another example, an already deposited material is not soluble in the deposition solvent(s) to a level detectable by a conventional analytical technique. The change in a film dimension or all film dimensions is 10% or less as compared to the as deposited film. In various examples, the change in a film dimension or all film dimensions is 5% or less, 4% or less, 3% or less, 2% or less, or 1% or less. In another example, there is no change in any film dimension in the as deposited film detectable by a conventional analytical technique. It is desirable the photoresist adheres to the surface on which it is deposited (e.g., the organic polymer material and/or substrate).

In the case of block copolymers having microdomains, the photoresist and photoresist deposition process results in a change of 10% or less in a dimension of a microdomain feature as compared to the as deposited film. In various examples, the change is 5% or less, 4% or less, 3% or less, 2% or less, or 1% or less. In another example, the photoresist and photoresist deposition process do not result in any change in a dimension of a microdomain feature detectable by a conventional analytical technique.

For example, fluorinated photoresists and water-based photoresists can be used. Suitable photoresist materials are commercially available and can be synthesized using methods known in the art. Examples of suitable fluorinated photoresists include, but are not limited to, Orthogonal SemiConductor Resist (OSCoR) and Ortho 310 (both OSCoR and Ortho 310 are commercially available from Orthogonal, Inc. (Ithaca, N.Y.)), or other polymer or molecular glass photoresists with sufficient fluorine content as to be soluble in a fluorinated solvent. In various examples, the photoresist materials have a fluorine content of 20% or more, 25% or more, 30% or more, 35% or more, 40% or more, 45% or more, or 50% or more by weight. Examples of water-based photoresists include, but are not limited to, fish gelatin-based photoresist materials (e.g., Norland Photoengraving glue), poly (vinyl alcohol), poly(acrylic acid), and poly(acrylamide) derivative materials.

The photoresist can be patterned to form exposed and unexposed regions of the underlying organic polymer material(s) by a variety of methods. Such methods are known in the art. For example, after depositing a layer of photoresist, creating a pattern in the photoresist (e.g., using conventional lithographic techniques such as exposure to a pattern of ultraviolet radiation, e-beam lithography, and nanoimprint lithography), and contacting the patterned photoresist layer with a solvent to selectively remove portion(s) of the photoresist soluble in the solvent leaving a pattern of photoresist not soluble in the solvent.

The layer of photoresist material can have a wide range of thicknesses. For example, the selectivity of the etch process can determine how thick a photoresist layer is required. Also, for example, the lift-off process may require a certain thickness of photoresist. Determining the necessary thickness of photoresist is within the purview of one having skill in the art. For example, the thickness of the photoresist layer can be from 5 nm to 5 um.

A wide variety of solvents can be used to deposit the photoresist or remove the patterned photoresist and portion of organic polymer material (e.g., a second organic polymer material) corresponding to the patterned photoresist. This step is commonly referred to as a lift-off process or step. For example, this lift off process can be used to selectively deposit an organic polymer material (e.g., a second organic polymer material) by depositing an organic polymer after the selective formation of a layer of an organic polymer material and removing the photoresist (and any organic polymer material deposited on the photoresist). The choice of solvent depends on the materials in the layers (e.g., the second organic polymer material and photoresist). Examples of suitable solvents include fluorinated solvents, water-based solvents, and supercritical $CO_2$. For example, if a fluorinated photoresist is used a fluorinated solvent can be used, and if a water-soluble photoresist is used water or a water-based solvent can be used. It is desirable the solvent not substantially affect the materials in the layers. For example, it is desirable that the solvent not cause undesirable levels of swelling, cracking, delamination, or intermixing of the materials in the layers.

For fluorinated photoresists, examples of suitable solvents include, but are not limited to, hydrofluoroethers ($C_xH_yOC_zF_w$) (such as methyl nonafluorobutyl ether, methylnonaflurorisobutyl ether, isomeric mixtures of methyl nonaflurobutyl ether and methyl nonafluoroisobutyl ether, ethylnonafluorobutyl ether, ethylnonafluoroisobutyl ether, isomeric mixtures of ethyl nonafluorobuyl ether and ethyl nonafluoroisolutyl ether), hydrofluorocarbons (HFCs, $C_xF_yH_z$) (such as 3-ethoxy-1,1,1,2,3,4,4,5,5,6,6,6-dodecafluoro-2-trifluoromethyl-hexane, 1,1,1,2,2,3,4,5,5,5,-decafluoro-3-methoxy-4-trifluromethyl-pentane, 1,1,1,2,3,3-hexafluoro-4-(1,1,3,4,4,4,-hexafluoropropoxy)-pentane), chlorofluorocarbons (CFCs) ($C_xCl_yF_z$), hydrochlorofluorocarbons (HCFC, $C_xCl_yF_zH_w$), perfluorocarbons (FCs, $C_xF_y$), perfluoroethers ($C_xF_yOC_zF$), perfluoroamines ($C_xF_y)_3N$, Trifluoromethyl ($CF_3$)-substituted aromatic solvents ($CF_3)_xPh$ (e.g., benzotrifluoride, bis(trifluoromethyl)benzene), and combinations thereof. For example, commercially available solvents, such as 1,1,1,2,2,3,4,5,5,5-decafluoro-3-methoxy-4-trifluoromethyl-pentane, 1,1,2,3,3-hexafluoro-4-(1,1,2,3,3,3,-hexafluoropropoxy)-pentane) (Novec™ HFE-7600) and 1,1,1,2,2,3,4,5,5,5-decafluoro-3-methoxy-4-(trifluoromethyl)-pentane (Novec™ HFE-7300), can be used.

The exposed portions of organic polymer material can be removed by a variety of methods/processes. Various methods of affecting the transfer of a pattern in a photoresist layer to the underlying layer of material are well-known in the art. Examples of suitable methods/processes include, but are not limited to, oxygen plasma dry etch processes and wet chemical etching processes. In an embodiment, after patterning of photoresist the exposed portion of first organic polymer material is removed using an anisotropic oxygen plasma etch process.

In an embodiment, where the photoresist is a fluorinated, negative-tone photoresist (e.g., OSCoR or Ortho 310) and the solubility of the photoresist (e.g., in the development solvent) is altered by a photochemically-initiated deprotection scheme, the method further comprises a step of contacting the patterned photoresist with a compound such as hexamethyldisilazane, heptamethyldisilazane, 1,1,3,3-tetramethyldisilazane, or isopropanol. This step is carried out after the step of removing the organic polymer material (e.g., by oxygen plasma etch). Without intending to be bound by any particular theory, it is considered that such treatment increases the hydrophobicity of the photoresist (which had been rendered hydrophilic during the photopatterning step) by reacting with exposed hydroxyl groups such that it can be removed with a fluorinated solvent.

The patterned structures of organic polymer materials can have a variety shapes and sizes (e.g., lateral dimensions and thicknesses). For example, the size of the structures (i.e., the minimum dimension (e.g., length or width) of the structure parallel to the substrate) can be from 10 nm to 10 microns, including all ranges therebetween. For example, the thickness of the structures can be from 5 nm to 10 microns, including all values to the nm and ranges therebetween. The structures of organic polymer material can have the same size or different sizes. The structures of first organic polymer material and second organic polymer material can have the same or different thicknesses. In the case of block copolymer materials having a removable block, the patterned structures can have sizes smaller than the structures formed by transfer of the photoresist pattern. In this case, the minimum length of the structures can be from 5 nm to 500 nm.

An advantage of the present invention is that the methods do not require use of a protective layer of material (e.g., perfluoroeicosane) that protects the layer(s) of organic polymer materials from solvents used during the process (e.g., solvents used in photoresist deposition, development, or removal (i.e., stripping)). Accordingly, in an embodiment the method does not require deposition of a protective layer of material on a layer of organic polymer material (e.g., a first or second layer of organic polymer material) prior to deposition of a layer of photoresist material.

Another advantage of the present invention is that methods provide a patterned layer or layers of organic polymer material such that the organic polymer materials are substantially unaffected by the process steps (e.g., process steps where the organic polymer materials are contacted by a solvent). By substantially unaffected it is meant that the physical properties (e.g., mechanical properties such as Young's modulus, hardness, toughness, film integrity (e.g., delamination, integrity, and pin hole density) and/or chemical properties (e.g., film composition) and/or electrical properties (e.g., conductivity, capacitance, and dielectric constant) and/or optical properties (e.g., refractive index, transparency, and haze), where the as deposited film exhibit such properties, are degraded by 10% or less. In various embodiments, the properties are degraded by 5% or less, 4% or less, 3% or less, 2% or less, and 1% or less. For example, if the film of organic polymer material is free of pin holes (as detectible by conventional analytical techniques) after deposition, it is free of detectible pin holes after the subsequent process steps (as detectible by conventional analytical techniques).

In an aspect, the present invention provides a layer or layers of patterned structures of two or more organic polymer materials on substrate. The patterned structures form a continuous layer or layers. For example, the layer or layers have a pattern of structures of a first organic polymer material and a pattern of structures of a second organic polymer material in the same layer.

In an aspect, the present invention provides uses of the layer or layers of polymer materials. For example, the layer or layers can be used in applications such as nanolithography or block copolymer lithography, organic electronic devices, semiconductors, bit patterned media, flash or other solid state memory, fuel cell membranes, light emitting diodes (LEDs) (e.g., organic light emitting diodes (OLEDs), thin film transistors (TFT), solar cells, sensors, microelectromechanical systems (MEMS), electrode patterning, nonvolatile memories, spin valves, and circuit elements (e.g., vias, resistors, capacitors, inductors, and the like). In an embodiment, a layer of polymer material(s) formed by the present invention is used as a hard-mask to transfer the pattern of the layer to another layer of material. In this embodiment, the organic polymer material.

The following examples are presented to illustrate the present invention. They are not intended to be limiting in any manner.

EXAMPLE 1

In the following example, two different block copolymers were spin-coated adjacent to each other in the same layer to demonstrate the CASP technique. Hydrofluoroether (HFE) (Novec™) solvents were obtained from 3M Co. and used as received. "OSCoR" photoresist was supplied by Orthogonal Inc. Triphenyl sulfonium triflate (TPST) photoacid generator was obtained from Aldrich and used as received. Tetramethoxymethylglycouril (TMMGU, "Powderlink 1174") was donated by Cytec Industries. All other solvents were obtained from Aldrich and used as received. PαMS-b-PHOST block copolymers ($M_n$=53,000 g/mol, $f_{P\alpha MS}$~34% (BCP1) and $M_n$=23,000 g/mol, $f_{P\alpha MS}$~30% (BCP2) were synthesized as reported previously. Poly(styrene) with an —OH end group (PS—OH, $M_n$=10,000 g/mol, PDI=1.07) was obtained from Polymer Source (Dorval, Canada) and used as received. Single-polished <100> Silicon wafers containing a ~2 nm native oxide layer were obtained from WRS (Spring City, Pa.).

Silicon wafers cleaned with oxygen plasma were coated with a 1 wt. % solution of PS—OH in methyl isobutyl ketone and annealed for 12 hours at 140° C. under vacuum. A dehydration reaction between the —OH groups of the polymer and the Si—OH groups on the cleaned silica wafers covalently bound PS—OH brushes to the silica surface. Excess polymer was washed off by soaking in toluene for 30 minutes and the wafer was blown dry with a stream of dry nitrogen. PαMS-b-PHOST was dissolved in propylene glycol methyl ether acetate (PGMEA), and the film thickness was controlled by varying the solution concentration and spin speed. BCP1 was mixed with 2 wt. % TPST photoacid generator and 4 wt. % TMMGU crosslinker relative to the weight of the polymer. BCP1 was spin coated at a thickness of 124 nm on top of the grafted PS—OH brush and solvent annealed for additional long-range order.

OSCoR photoresist was spin coated on top of the crosslinked block copolymer film (thickness ~650 nm) and exposed to 365 nm UV radiation using a GCA Autostep 200 DSW i-line Wafer Stepper (Dose=18.7 mJ/cm$^2$) through a photomask. After exposure, the films were baked for 60 seconds at 75° C., and then developed in HFE 7300 for approximately 30 seconds. Oxygen plasma etching was performed using a Plasmatherm 72 (50 sccm $O_2$, 60 mTorr, 100 W) to etch through BCP1 while also etching about half of the thickness of the OSCoR. HMDS priming treatment of the exposed Ortho 310 pattern was performed in a Yield Engineering Systems (YES-LPIII) vacuum oven. The second block copolymer (BCP2) was puddled in the exposed windows of the substrate followed by spin coating at 2000 rpm for 60 seconds. Finally, the wafer was immersed in HFE 7600 for three minutes under sonication to remove the remaining OSCoR material.

In order to ensure the non-interaction of the block copolymer in the hydrofluoroether (HFE) processing solvent, a solvent-annealed block copolymer film (BCP1) was immersed in a bath of one of the stronger hydrofluoroether solvents, HFE 7600, and examined the morphology before and after solvent exposure. Experimental data verified the cylindrical morphology remained unharmed after exposure to HFE 7600 before and after solvent exposure.

To begin the orthogonal processing of two block copolymers on the same layer, the first block copolymer (BCP1, $L_o$=48 nm) is spin coated on top of a polystyrene brush. The polystyrene brush was used to preferentially attract the PαMS domain for the creation of parallel-oriented cylinders, as well as ease the mobility of the polymer during the solvent annealing step through a reduction in substrate pinning Afterwards, the polymer was photocrosslinked using a flood exposure to 254 nm radiation to prevent lift-off in future deposition steps.

For the first patterning step, a thick layer of OSCoR was dissolved in HFE 7600, spin coated as a thick (~650 nm) film and lithographically patterned using 365-nm irradiation. The ultraviolet radiation triggered the release of acid from a photoacid generating molecule blended into the resist. The acid deprotected the tert-butyl groups present in the photoresist, transforming the polymer into the HFE-phobic form containing hydroxyl groups. The resist could be patterned with a lower dose if a stronger developing solvent was used, which made the polymer easier to lift off later in the process flow.

The unexposed OSCoR was then washed away to open up windows for the subsequent oxygen plasma etching of BCP1, via a subtractive patterning approach. The relative etch rates of both the OSCoR (4-5 nm/sec) and BCP1 (1.5 nm/sec) were taken into account to make sure that a sufficient amount of OSCoR remained to protect the underlying BCP1 during the deposition of BCP2. Approximately 360 nm of OSCoR remained after the etching process was complete, and windows of silica were exposed in preparation for the spin coating of BCP2.

An organosilane (hexamethyldisilazane, HMDS) vapor priming treatment was required before the application of BCP2, for two reasons. First, hydroxyl groups of PMAA from the exposed OSCoR must be capped to restore HFE solubility for subsequent lift-off. The HMDS vapor diffused into the exposed resist and efficiently capped most —OH groups with the more HFE-philic methylated silica moiety. Second, the capping of the polar —OH groups on PMAA with HMDS created a more hydrophobic polymer surface that resisted the adhesion of BCP2 during spin coating. If BCP2 adhered well to the surface of the OSCoR it became much harder to lift off afterward in the HFE stripping bath. The water contact angles of the resist before and after HMDS treatment were investigated. The HMDS-capped resist showed a water contact angle approximately 4° higher, indicating a slightly lower surface energy than the neat OSCoR. The vapor primed resist removed cleanly and left behind smooth underlying films. The film thickness after stripping was equal to 124 nm, equivalent to the film thickness of BCP1. Therefore, HMDS had restored full HFE solubility to the fluorinated photoresist and allowed for a complete removal of the resist from the block copolymer film.

Figure 7:
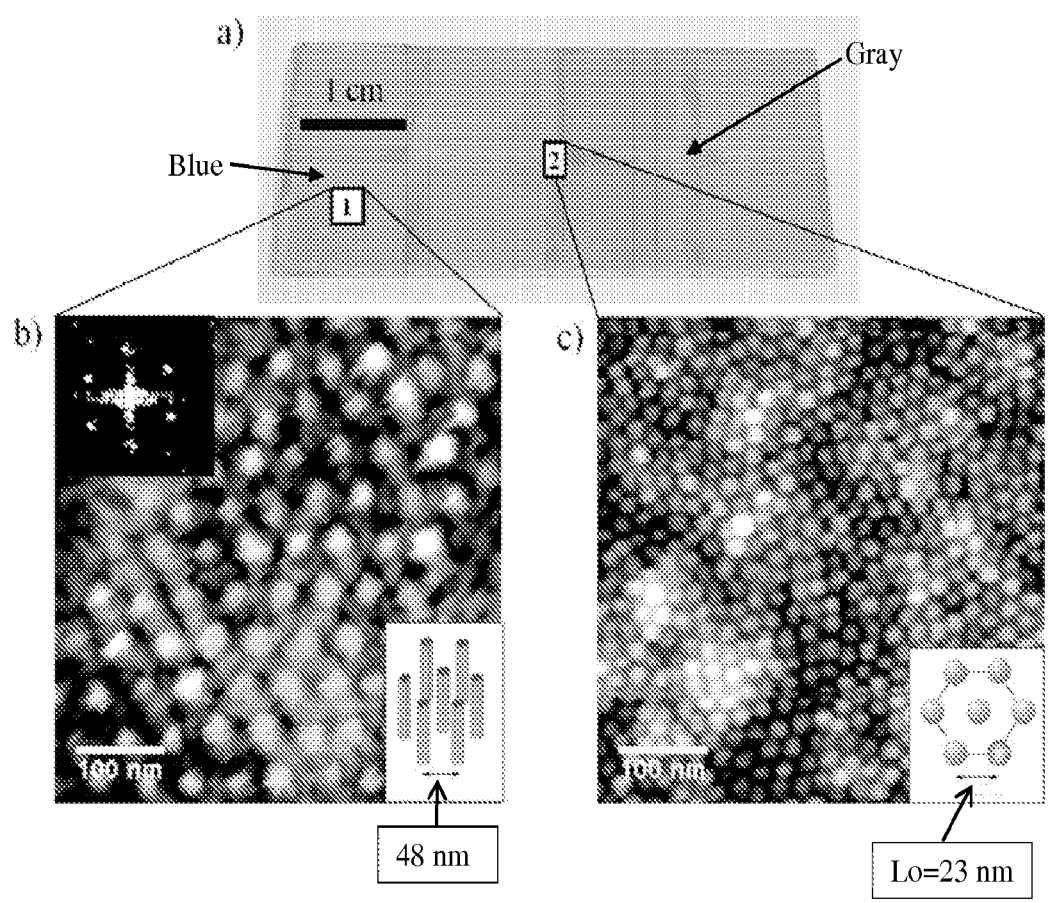
FIG. 7. a) Picture of a wafer after the final patterning step, showing two different block copolymer films spin coated on the same wafer. The lithographically patterned (blue) squares representing Region 1 are approximately 1 $cm^2$ in area and approximately 50 nm thick, surrounded by Region 2, which is approximately 25 nm thick. b) Representative phase AFM image and FFT (inset) taken in Region 1, showing morphology of BCP1 (center-center spacing=48 nm) and c) representative phase AFM image taken in Region 2, showing morphology of BCP2 ($L_o$=23 nm).

The HMDS vapor also reacts with the silanol groups on the exposed silica surface, which makes the surface more hydrophobic, but not hydrophobic enough to block the adhesion of the second block copolymer to adhere to the wafer. The PGMEA solution for the BCP2 ($L_o$=23 nm) was puddled on top of the HMDS-primed silica surface and the OSCoR resist and spin coated. If BCP1 was not crosslinked before being covered by OSCoR, partial lift-off of the BCP1/OSCoR film stack would occur. This caused major distortion of the patterns, compared to the film stack from crosslinked BCP1. The only interaction of the crosslinked BCP1 and the PGMEA solvent occurred at the cross-section of each BCP1/OSCoR film stack, which should not cause any significant swelling of the film. Then, the wafer was soaked in HFE 7600 to remove the OSCoR, which exposed the underlying BCP1. Some difficulty was observed in getting the resist to remove completely at first, due to a small amount of BCP2 film covering its surface and blocking HFE solvent entry into the resist. After ten minutes of exposure to HFE 7600, some pieces of the OSCoR were still left clinging to the underlying polymer. These could be removed by sonicating the wafer in HFE7600 for three minutes, leaving behind squares of BCP1 surrounded by a matrix of BCP2, as shown in FIG. 7. The composite film could then be solvent annealed to gain long-range ordering in the uncrosslinked BCP2 region.

Atomic force microscopy was used to analyze the respective block copolymer morphologies located in each region of the wafer. Each block copolymer was deliberately spin-coated at a different thickness to be able to delineate the separate block copolymer films more clearly using the optical microscope attached to the AFM. Region 1 (blue film) in FIG. 7 shows the wafer area coated by the thicker BCP1 film (124 nm), whereas region 2 (gray film) shows the area coated by the thinner (25 nm) BCP2 film. The AFM image of BCP1 clearly shows block copolymer morphology indicating no significant amount of residue is left over from the OSCoR coating. Furthermore, the periodic morphology displays a length scale characteristic of each type of block copolymer used for deposition. In BCP1, an array of dots is observed, which is caused by the incommensurate film thickness in this sampled region. Variations in film thickness are well known to lead to local vertical orientations of cylindrical domains. As a result, the length scale separating the dots equal to ~48 nm, corresponding to $(\sqrt{3}/2)*L_o$, equivalent to the spacing in between each row of hexagonally packed microdomains was observed. Similarly, the spacing of the morphology in BCP2 was equivalent to 23 nm, characteristic of the spherical morphologies observed for this block copolymer after processing with acetone vapor. The interface between the two morphologies appeared continuous, although the large length scale used for patterning in this example did not allow for the imaging of a distinct interface between the films using AFM. Smaller patterned feature sizes for the OSCoR patterning were possible with no alteration to the technique presented herein.

EXAMPLE 2

In this example the non-interaction between the block copolymer film and hydrofluoroether (HFE) solvents was investigated for orthogonal processing Materials. Hydrofluoroether solvents (HFEs, Novec™ Engineered Fluids) were obtained from 3M Corporation and used as received. Organic SemiConductor Resist (OSCoR) was supplied by Orthogonal Inc. Triphenyl sulfonium triflate (TPST, photoacid generator) was obtained from Sigma-Aldrich and used as received. Tetramethoxymethylglycouril (TMMGU, "Powderlink 1174") was donated by Cytec Industries. All other solvents were obtained from Sigma-Aldrich and used as received. PαMS-b-PHOST block copolymers ($M_n$=53,000 g/mol, $f_{P\alpha MS}$~34% (BCP1) and $M_n$=23,000 g/mol, $f_{P\alpha MS}$~30% (BCP2) were synthesized according to known literature procedures. Hydroxyl-terminated polystyrene (PS—OH) was obtained from Polymer Source and used as received. Single-polished <100> Silicon wafers with native oxide layer were obtained from WRS Materials.

Block Copolymer Film Preparation. Silicon wafers cleaned with $O_2$ plasma were coated with a 1 wt. % solution of PS—OH in methyl isobutyl ketone and annealed for 12 hours at 140° C. under vacuum to graft a layer of PS—OH to the substrate. Unbound polymer was washed off by soaking the wafers in toluene for 30 minutes and then the wafers were blown dry with a stream of dry $N_2$. PαMS-b-PHOST, TPST (2 wt. % over the block copolymer) and TMMGU (4 wt. % over the block copolymer) were dissolved in propylene glycol methyl ether acetate (PGMEA), and deposited on the Si wafer pre-treated with PS—OH at a thickness of 124 nm Two PαMS-b-PHOST samples with different molecular weights were deposited and solvent annealed. After solvent annealing BCP1, the film was flood-exposed with a large dose of 254 nm UV irradiation (Dose=360 mJ/cm$^2$) and then baked for 60 seconds at 115° C., resulting in crosslinked films.

Figure 8:
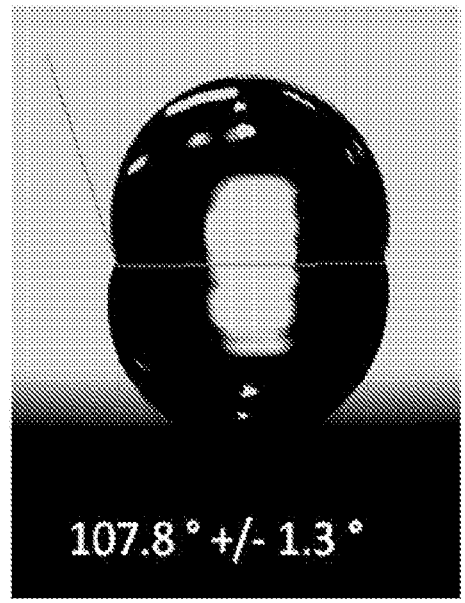
FIG. 8. Water contact angle of exposed OSCoR before treatment with HMDS vapor.
Figure 9:
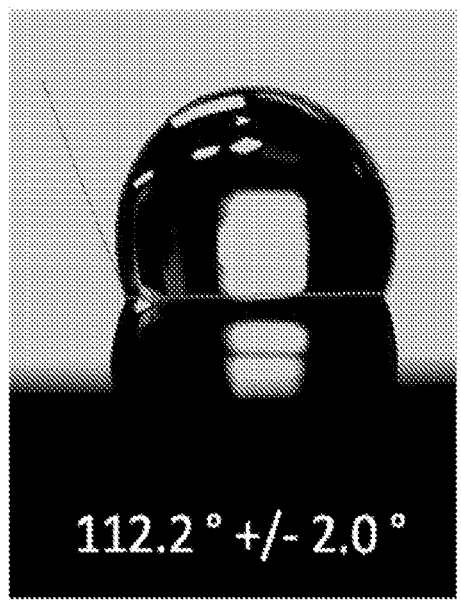
FIG. 9. Water contact angle of exposed OSCoR after treatment with HMDS vapor.

OSCoR Deposition and Patterning. A film of OSCoR (thickness ~650 nm) was applied by spin-coating on top of the crosslinked block copolymer film and was subsequently exposed to 365 nm UV radiation using a GCA Autostep 200 DSW i-line Wafer Stepper (Dose=18.7 mJ/cm$^2$). After exposure, the films were baked for 60 seconds at 75° C., and then developed in HFE-7300 for approximately 30 seconds to expose underlying block copolymer film. $O_2$ plasma etching was performed using a PlasmaTherm 72 (50 sccm $O_2$, 60 mTorr, 100 W) to remove the block copolymer patterns in the exposed regions. In the process, about half (~325 nm) of the thickness of the remaining OSCoR was removed. 1,1,1,3,3,3-Hexamethyldisilazane (HMDS) treatment of the exposed OSCoR patterns was performed in a Yield Engineering Systems (YES-LPIII) vapor priming oven. The water contact angle of the exposed OSCOR surface before and after HMDS priming is shown in FIGS. 8 and 9. The second block copolymer (BCP2) was puddled in the exposed windows of the substrate followed by spin coating at 2000 rpm for 60 seconds, followed by a brief post-apply bake at 115° C. for 60 seconds to remove residual solvent. Finally, the wafer was immersed in HFE 7600 for three minutes under sonication to remove the remaining OSCoR.

Characterization. Scanning probe microscopy was performed using a Veeco Dimension 3100 atomic force microscope operated in tapping mode. Olympus cantilevers were used (Spring constant=42 N/m, radius <=10 nm) along with Nanoscope imaging software for the analysis. Water contact angle measurements were executed using a VCA Optima contact angle measurement system, by averaging five measurements per sample.

A solvent-annealed poly(α-methylstyrene-block-hydroxystyrene) (PαMS-b-PHOST, $M_n$=53,000 g/mol, 33% PαMS) block copolymer film featuring a monolayer of parallel cylinders (hereby referred to as BCP1) was immersed in a bath containing HFE-7600, a solvent used to spin-coat the semi-fluorinated resist OSCoR, and the morphology before and after solvent exposure was examined. FIGS. 3-6 show that the film morphology remains unharmed upon exposure to HFE-7600. The microdomain periodicity ($L_o$) of the cylinders in this layer measured ~57 nm, before and after soaking in the HFE solvent for two minutes, indicating little to no swelling of the copolymer morphology. This provided the first solid ground for the proposed patterning method.

To begin the process, BCP1 was spin-coated at a thickness of 50 nm on top of a (~2-3 nm) polystyrene brush layer (PS—OH). The polystyrene brush was used to increase the mobility of the polymer segments during the solvent annealing step through a reduction in substrate pinning. The majority phase PHOST segment in the block copolymer was then photo-crosslinked using a flood exposure to 254 nm radiation. For the first patterning step, a layer (~650 nm) of a semi-fluorinated photoresist (OSCoR) was spin-coated on top of BCP1, and patterned using 365-nm irradiation through a photomask. OSCoR contains a semi-perfluorinated component, which allows its solubility in hydrofluoroether solvents, along with carboxyl groups that are protected by an acid-labile tert-butyl functional group. UV radiation triggers the release of strong acid from a photoacid generator blended into the resist, which deprotects the tert-butyl functional groups and transforms the resist into a —COOH containing HFE-insoluble form. The solubility switch allows for negative-tone pattern development after soaking in a HFE-based developer. The unexposed OSCoR was then washed away with a hydrofluoroether solvent to open up windows for the subsequent $O_2$ reactive ion etching (RIE) of BCP1 (subtractive patterning). The relative $O_2$ etch rates of both the OSCoR (4-5 nm/sec) and BCP1 (1.5 nm/sec) were taken into account, to ensure that a sufficient amount of OSCoR remained to protect the top surface of the underlying BCP1 during the deposition of the second block copolymer solution. Approximately 360 nm of OSCoR remained after the RIE step was complete, and windows of silica were exposed for the deposition of the second block copolymer.

Another block copolymer with a smaller intrinsic length scale was used to microscopically distinguish between the two separate block copolymer films. Also, a more dilute solution was also used to spin-coat the film, giving rise to a different film color due to the interference between the light that reflects off the top and bottom surfaces of the film. Before the application of the second block copolymer (BCP2, $M_n$=23,000 g/mol, $L_o$=23 nm), a hexamethyldisilazane (HMDS) vapor treatment of the exposed OSCoR film was required for two reasons. Firstly, the HMDS vapor diffuses into the exposed resist and efficiently caps most —COOH groups with the more HFE-philic trimethylsilyl moieties, creating a solubility switch. Secondly, the bound TMS groups create a more hydrophobic polymer surface that resists polymer adhesion to the top of the OSCoR film. If BCP2 adhered well to the surface of the OSCoR, possibly through interactions between the polar functional groups in both materials, it became much harder to lift off the resist afterward in the HFE-based stripping bath. The water contact angle measurement of the resist films before and after HMDS treatment showed approximately 4° higher values, as shown in FIGS. 8 and 9, which indicates a slightly lower surface energy of the HMDS-treated OSCoR film.

While the HMDS vapor also reacted with the silanol groups on the exposed silica surface, this treatment does not make the exposed $SiO_2$ surface too hydrophobic for the BCP2 film to adhere to the wafer during spin coating. At this step, if the predefined BCP1 patterns were not crosslinked, the BCP1/OSCoR film stack would partially delaminate from the silicon substrate, causing a major distortion of the patterns. After both block copolymer films were deposited, the wafer was sonicated in HFE-7600 to remove the HMDS-treated OSCoR film left on top of BCP1, leaving behind squares of BCP1 surrounded by a matrix of BCP2, as shown in FIG. 7. The film thickness of the BCP1 region equaled ~50 nm, equivalent to the original spin-coated film thickness, which quantified complete removal of the OSCoR. The BCP2 film was solvent-annealed in the presence of acetone vapor to form spheres with improved long-range order. Since it was completely crosslinked previously, the BCP1 morphology was not significantly affected by the acetone vapor.

Atomic force microscopy was used to sample the respective block copolymer morphologies located in each region of the wafer. Region 1 in FIG. 7 shows the wafer area coated by the thicker (blue) BCP1 film, whereas region 2 shows the area coated by the thinner (gray) BCP2 film. The AFM image of BCP1 (FIG. 7) clearly shows ordered block copolymer morphology indicating that no significant amount of residue is left over from the OSCoR photoresist coating exists. THF annealing of cylindrical PαMS-b-PHOST films leads to films with enhanced long-range order of cylindrical microdomains. In this region a combination of parallel and perpendicular cylinder orientations, due to variations of film thickness in this sampled region was observed. An area of perpendicular cylinders was selected for comparison to the smaller length scale of the spheres of Region 2. The length scale separating the cylinders in region 1 is equal to ~48 nm, corresponding to $(\sqrt{3}/2)*L_o$, equivalent to the spacing in between each row of hexagonally packed microdomains. In region 2, after acetone vapor annealing, the spacing of the spheres in BCP2 was equal to 23 nm, as shown in FIG. 7.

Careful observation of the interface between the two block copolymers was important for future applications in integrated circuitry. No gaps were observed in between the two films, as observed from optical microscopy. Due to the large length scale used for patterning, it was difficult to observe the transition in microdomain periodicity between the two block copolymers using scanning electron microscopy. Higher magnifications did not show a transition in morphology, and lower magnifications showed a drop in film thickness, but were not able to capture the sub-50 nm microdomains. Smaller feature sizes for OSCoR patterning, such as those formed with 248 nm, 193 nm, or e-beam lithography, will enable higher resolution placement for each successive block copolymer deposition. It should also be noted that additional block copolymer films could be deposited simply by iterating the orthogonal processing technique. As long as the underlying polymers are crosslinked, the non-interacting semi-fluorinated resist can be used to open up "windows" in the films using lithography, which can be used for any number of subsequent additive material depositions.

EXAMPLE 3

The following is an example of a method of the present invention.
Experimental Methods
Materials. Hydrofluoroether (HFE) (Novec™) solvents were obtained from 3M Corporation and used as received. Poly($^1$H,$^1$H,$^2$H,$^2$H-perfluorodecyl methacrylate-ran-tert-butyl methacrylate) (P(FDMA-ran-TBMA), "Ortho 310") photoresist was supplied by Orthogonal Inc. Triphenyl sulfonium triflate (TPST) photoacid generator was obtained from Aldrich and used as received. Tetramethoxymethylglycouril (TMMGU, "Powderlink 1174") was donated by Cytec Industries. All other solvents were obtained from Aldrich and used as received. PαMS-b-PHOST block copolymers ($M_n$=53,000 g/mol, $f_{\alpha MS}$~34% (BCP1) and $M_n$=23,000 g/mol, $f_{P\alpha MS}$~30% (BCP2) were synthesized according to known literature procedures. Poly(styrene) with an ~OH end group (PS—OH) was obtained from Polymer Source (Dorval, CA) and used as received. Single-polished <100> Silicon wafers containing a ~2 nm native oxide layer were obtained from WRS materials (Spring City, Pa.).

Film Preparation. Silicon wafers cleaned with oxygen plasma were coated with a 1 wt. % solution of PS—OH in methyl isobutyl ketone and annealed for 12 hours at 140° C. under vacuum. A dehydration reaction between the —OH groups of the polymer and the Si—OH groups on the cleaned silica wafers covalently bound PS—OH brushes to the silica surface. Excess polymer was washed off by soaking in toluene for 30 minutes and was blown dry with a stream of dry nitrogen. PαMS-b-PHOST was dissolved in propylene glycol methyl ether acetate (PGMEA), and the film thickness was controlled by varying the solution concentration and spin speed. The solutions were mixed with 2 wt. % TPST photoacid generator and 4 wt. % TMMGU crosslinker relative to the weight of the polymer. Both PαMS-b-PHOST molecular weights were spin coated on top of the grafted PS—OH brush and solvent annealed. The solvent annealing was performed in a 1 L glass dessicator with 5 mL of either tetrahydrofuran (~8 hours) or acetone (~5 hours) solvent placed in a small petri dish cover at the bottom of the chamber. Vacuum grease was applied liberally underneath the glass lid to ensure a good seal and the formation of a saturated solvent vapor inside the chamber. After solvent annealing, the block copolymer was flood exposed to 254 nm UV irradiation (Dose=360 mJ/cm$^2$) and baked for 60 seconds at 115° C. to accelerate the acid catalyzed crosslinking reaction. For the second block copolymer deposition, no crosslinking was necessary after the solvent anneal.

Ortho 310 Deposition and Patterning. Ortho 310 photoresist was spin coated on top of the crosslinked block copolymer film (thickness ~650 nm) and exposed to 365 nm UV radiation using a GCA Autostep 200 DSW i-line Wafer Stepper (Dose=18.7 mJ/cm$^2$). After exposure, the films were baked for 60 seconds at 75° C., and then developed in HFE 7300 for approximately 30 seconds. Oxygen plasma etching was performed using a Plasmatherm 72 (50 sccm $O_2$, 60 mTorr, 100 W) to etch through the block copolymer and about half of the thickness of the Ortho 310. HMDS priming treatment of the exposed Ortho 310 patterns was performed in a Yield Engineering Systems (YES-LPIII) vacuum oven.

Characterization. Scanning probe microscopy was performed using a Veeco Dimension 3100 operated in tapping mode. Olympus cantilevers were used (Spring constant=42 N/m, radius <=10 nm) and Nanoscope imaging software was used for the analysis. Water contact angle measurements were executed using a VCA Optima contact angle measurement system.

Figure 3:
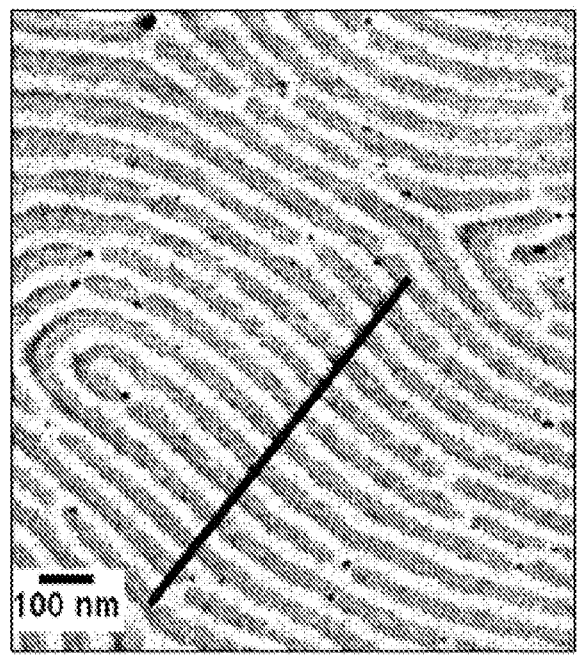
FIG. 3. AFM image of P$\alpha$MS-b-PHOST "BCP1" annealed in tetrahydrofuran vapor before exposure to HFE-7600.
Figure 4:
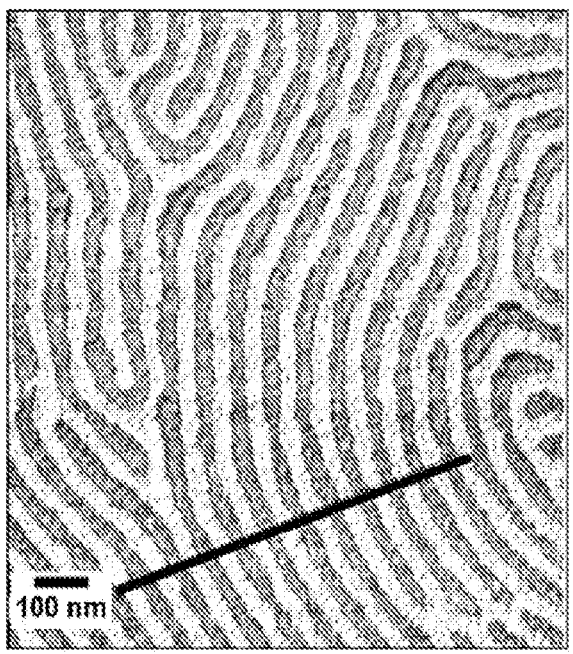
FIG. 4. AFM image of P$\alpha$MS-b-PHOST "BCP1" annealed in tetrahydrofuran vapor after soaking in HFE-7600 for 2 minutes.
Figure 5:
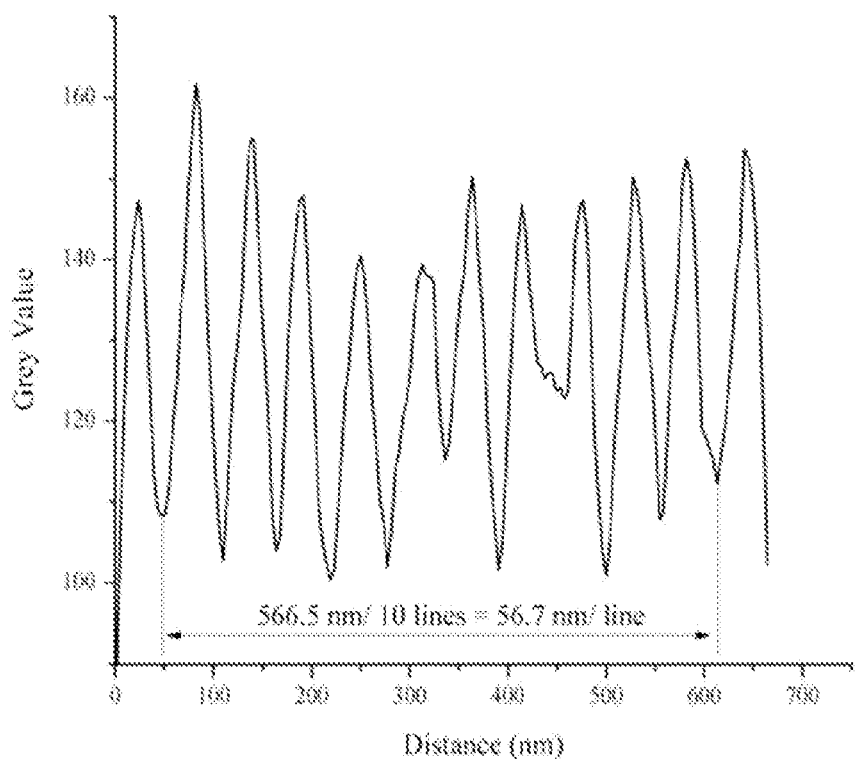
FIG. 5. Line-scans through 10 lines from FIG. 3 to show that the orthogonal solvent does not affect the microdomain morphology in the film.
Figure 6:
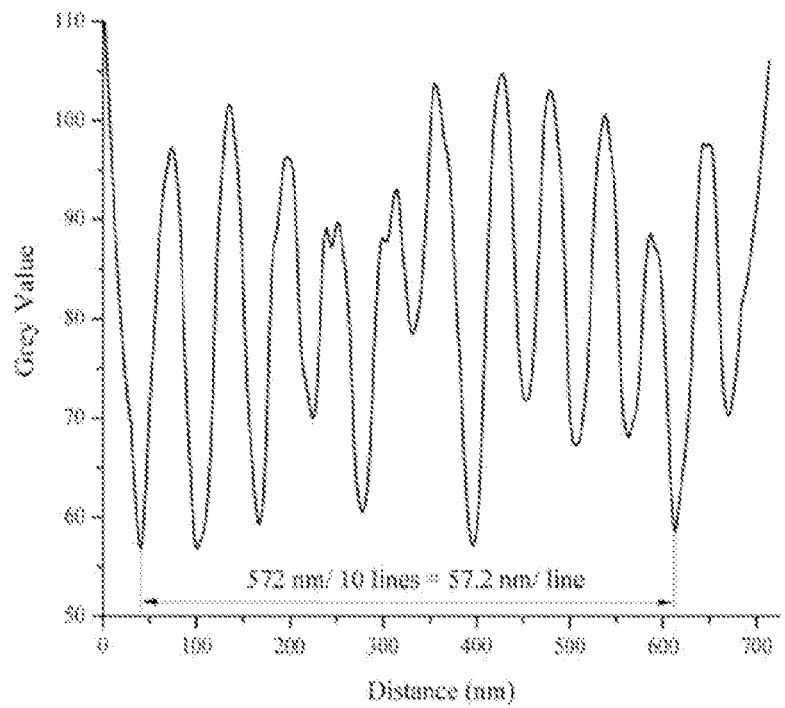
FIG. 6. Line-scans through 10 lines from FIG. 4 to show that the orthogonal solvent does not affect the microdomain morphology in the film.

In order to ensure the non-interaction of the block copolymer in the hydrofluoroether (HFE) processing solvent, a solvent-annealed block copolymer film (BCP1) was soaked in a bath of one of the stronger hydrofluoroether solvents, HFE 7600, and morphology was examined before and after solvent exposure. FIGS. 3 and 4 show that the morphology remains unharmed upon exposure to HFE 7600. To begin the process, the first block copolymer (BCP1, $L_o$=45 nm) is spin coated on top of a polystyrene brush. The polystyrene brush is used to preferentially attract the PαMS domain for the creation of parallel-oriented cylinders, as well as ease the mobility of the polymer during the solvent annealing step through a reduction in substrate pinning. The polymer was then photocrosslinked using a flood exposure to 254 nm radiation.

Figure 11:
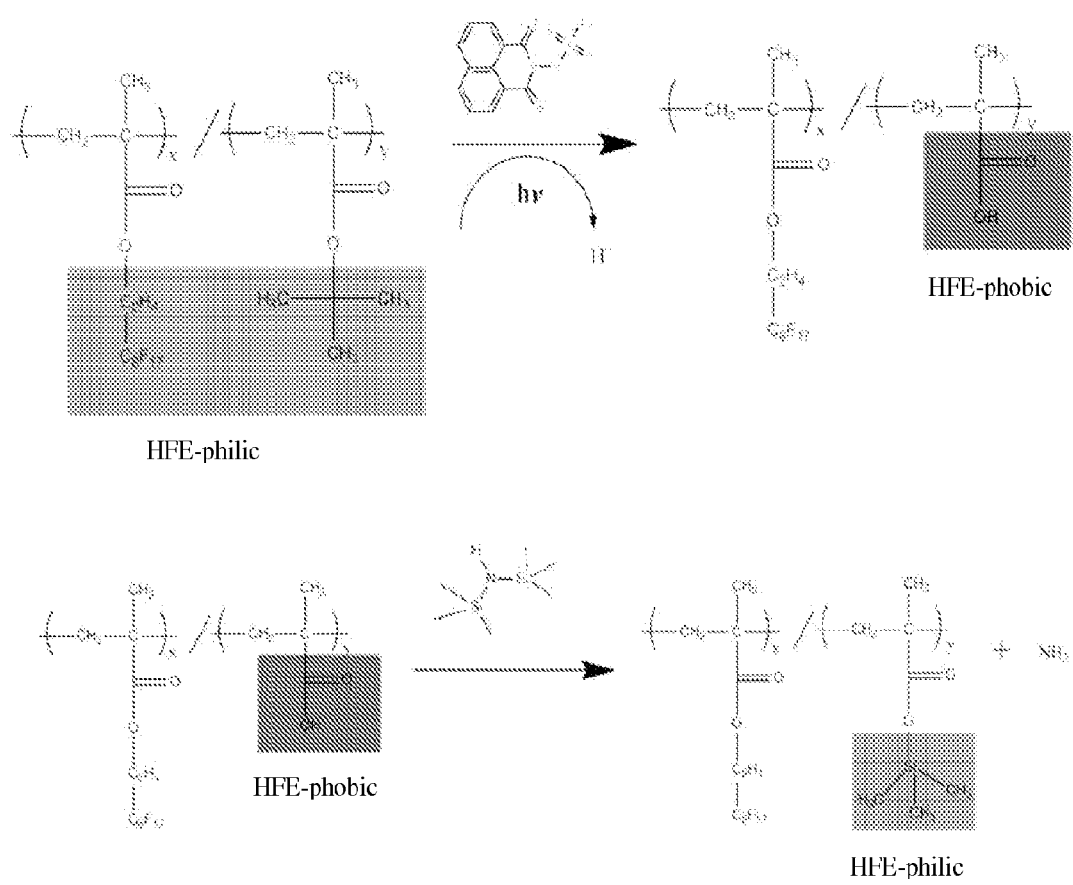
FIG. 11. Chemical reaction of P(FDMA-ran-MAA) with HMDS restores its ability to dissolve in HFE solvents.

For the first patterning step, a thick layer of a semifluorinated polymeric photoresist P(FDMA-ran-TBMA) was dissolved in HFE 7600, spin coated as a thick (~650 nm) film and photolithographically patterned using 365 nm irradiation. The ultraviolet radiation triggers the release of acid from a photoacid generating molecule blended into the resist. The acid deprotects the tert-butyl groups on the PTBMA component of the photoresist, transforming the polymer into the HFE-phobic poly(methacrylic acid) (PMAA), as shown in FIG. 11. T the resist could be patterned with a lower dose if a stronger developing solvent was used, which made the polymer easier to lift off later in the process flow. The unexposed Ortho 310 was then washed away to open up windows for the subsequent oxygen plasma etching of BCP1 (subtractive patterning). The relative etch rates of both the Ortho 310 (4-5 nm/sec) and BCP1 (1.5 nm/sec) were taken into account, to make sure that a sufficient amount of Ortho 310 remained to protect the underlying BCP1 for the subsequent exposure to PGMEA during the deposition of BCP2. Approximately 365 nm of Ortho 310 remains after the etching process is complete, and windows of silica are exposed for the next step.

An organosilane (hexamethyldisilazane, HMDS) vapor priming treatment was required before the application of BCP2, for two reasons. First, the hydroxyl groups of PMAA must be capped to restore HFE solubility to P(FDMA-ran-TBMA). The HMDS vapor diffused into the exposed resist and efficiently capped most —OH groups with the more HFE-philic methylated silica moiety, as shown in FIG. 11. Second, the capping of the polar —OH groups on PMAA with HMDS creates a more hydrophobic polymer surface that resists the adhesion of BCP2 during spin coating. If BCP2 adheres well to the surface of the Ortho 310 it becomes much harder to lift it off afterward in the HFE stripping bath. The water contact angles of the resist before and after HMDS treatment were investigated. The HMDS-capped resist showed a water contact angle approximately 4° higher, as shown in FIGS. 8 and 9 indicating a slightly lower surface energy than the neat (FDMA-ran-MAA).

The performance of an HMDS liquid priming method to cap the P(FDMA-ran-MAA) was examined. In this method, the resist is dehydrated by baking on a hotplate at 150° C. for 1 minute, then a 20% (w/w) HMDS solution in PGMEA is puddled onto the wafer and allowed to react for 1 minute before spinning off. The resist was then stripped by soaking in HFE 7600 for approximately ten minutes. Comparing the ability to strip the resist after vapor priming and liquid priming, the liquid HMDS primed resist appeared hazy and rough after stripping, perhaps as a result of the liquid only reacting with the top surface of the resist. The low reflectance of this film made it difficult to get a quantitative measurement of the thickness of the film stack. However, the vapor primed resist removed cleanly and produced smooth underlying films. The film thickness after stripping was equal to 124 nm, equivalent to the film thickness of BCP1. Therefore, HMDS has restored full HFE solubility to the photoresist and allowed for a complete lift-off of the fluorinated photoresist.

Figure 12:
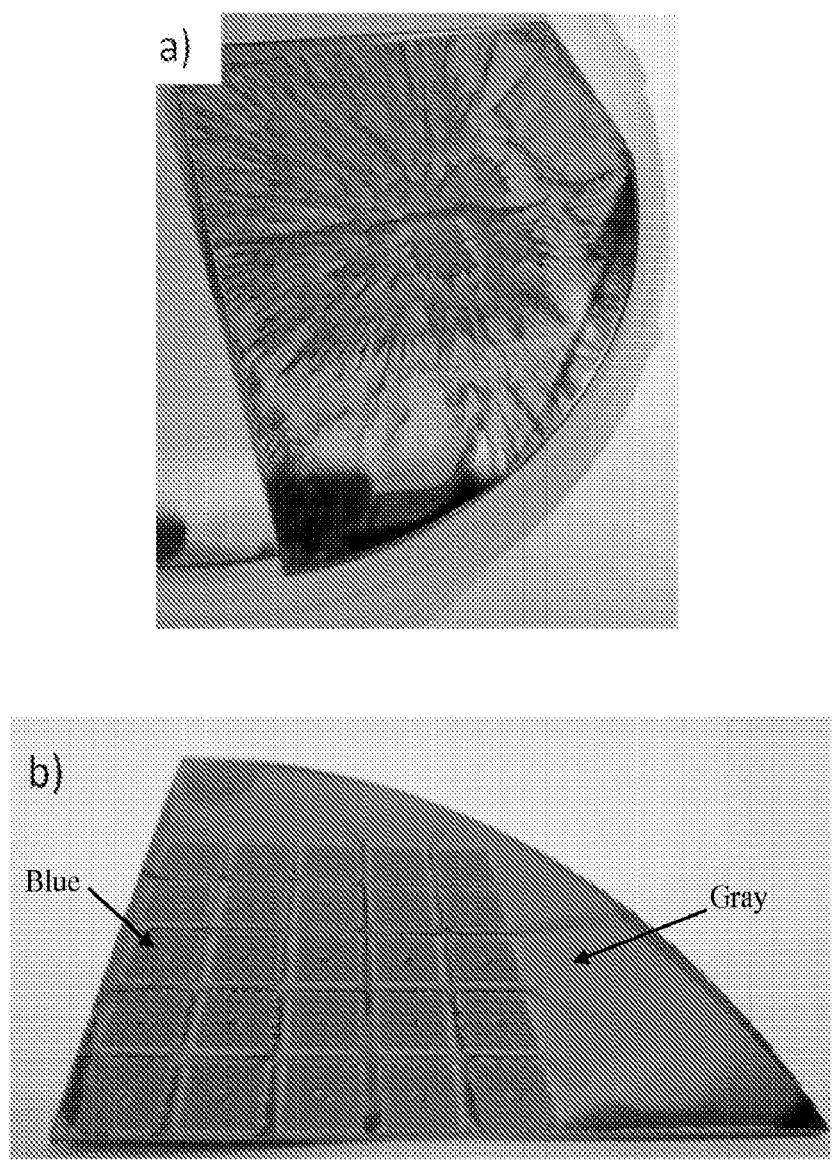
FIG. 12. Comparison of the integrity of the patterned film-stack after spin coating BCP2 with a) uncrosslinked BCP1, and b) crosslinked BCP1.

The HMDS vapor also reacts with the silanol groups on the exposed silica surface, which makes the surface more hydrophobic, but not hydrophobic enough to destroy the ability for BCP2 to adhere to the wafer. The PGMEA solution for the second block copolymer was puddled on top of the HMDS-primed silica surface and Ortho 310 resist and spin coated at 2000 rpm for 60 seconds. At this step, if BCP1 was not crosslinked before being covered by Ortho 310, partial lift-off the BCP1/Ortho 310 film stack would occur. This caused major distortion of the patterns, as shown in FIG. 12(a), compared to the film stack from crosslinked BCP1 in FIG. 12(b). The only interaction of the crosslinked BCP1 and the PGMEA solvent occurs at the cross-section of each BCP1/Ortho 310 film stack, which should not cause any extensive swelling. No post-apply bake was performed on the BCP2 film after spin coating. Then, the wafer was soaked in HFE 7600 to remove the Ortho 310 and expose BCP1. Some difficulty in getting the Ortho 310 to remove completely, due to a small amount of BCP2 film covering its surface and blocking HFE solvent entry into the resist was observed. After ten minutes of exposure to HFE 7600, some pieces of the Ortho 310 were still left clinging to the underlying polymer. These could be removed by sonicating the wafer in HFE7600 for three minutes, leaving behind squares of BCP1 surrounded by a matrix of BCP2. The composite film could then be solvent annealed to gain long-range ordering in the uncrosslinked BCP2 region.

Atomic force microscopy was used to analyze the respective block copolymer morphologies located in each region of the wafer. Each block copolymer was deliberately spin coated at a different thickness to be able to delineate the separate block copolymer films more clearly using the optical microscope attached to the AFM. One region shows the wafer area coated by BCP1 and a second region shows the area coated by BCP2. The AFM image of BCP1 clearly shows the morphology, indicating that no significant amount of residue is left over from the Ortho 310 coating. Also, the domain sizes are the same before and after the patterning process, indicating little to no swelling taking place during any of the process steps. This is an example of two different polymer films being spin coated adjacent to each other on the same layer without any damage or intermixing.

This is an example of a process that allows for the orthogonal processing of polymer films in a combined additive and subtractive patterning (CASP) approach. Two block copolymers with different self-assembled domain sizes and pitches were deposited adjacent to one another on the same layer of a silicon wafer surface. It was shown that for the materials used in this example the first polymer must be crosslinked to avoid lift-off during the spin coating of the second polymer, which is an ability of the PαMS-b-PHOST copolymer used in this example. The CASP approach is designed to minimize swelling of the crosslinked resist due to solvent exposure. This approach can be extended to the patterning of multiple functional polymers on the same layer for many other applications in electronics, biology, etc.

While the invention has been particularly shown and described with reference to specific embodiments (some of which are preferred embodiments), it should be understood by those having skill in the art that various changes in form and detail may be made therein without departing from the spirit and scope of the present invention as disclosed herein.

What is claimed is:

1. A method of forming a layer of patterned organic polymer materials on a substrate comprising:
    a) forming a layer of an organic polymer material on a substrate, wherein the organic polymer material in step a) is a block copolymer;
    b) selectively removing at least a portion of the organic polymer material thereby exposing portions of the substrate using an orthogonal photoresist;
    c) selectively forming a layer of an organic polymer material on the exposed portions of the substrate; and
    d) optionally, repeating steps b) and c), wherein each added organic polymer material in step c) is different from the organic polymer material or polymer materials already formed on the substrate.

2. The method of claim 1, further comprising forming one or more patterned organic polymer materials layers on the organic polymer materials layer formed after step c) by alternating steps of selectively forming a layer of an organic polymer material using an orthogonal photoresist and adding an organic polymer material to the space created by the selective forming.

3. The method of claim 2, wherein the steps of selectively forming the layer of the organic polymer material using the orthogonal photoresist and adding the organic polymer material to the space created by the selective forming can be repeated from 1 to 10 times, such that a plurality of layers are formed.

4. The method of claim 1, wherein the substrate is a silicon wafer having a layer of polymer material disposed thereon and chemically bonded thereto.

5. The method of claim 4, wherein the polymer material is poly(hydroxystyrene).

6. The method of claim 1, wherein all of the organic polymer materials are block copolymers.

7. The method of claim 6, further comprising an annealing step after step a) and/or step c).

8. The method of claim 1, wherein the organic polymer material deposited in step a) has cross-linkable moieties, the method further comprising the step of cross-linking the organic polymer material deposited in step a).

9. The method of claim 8, wherein the organic polymer material deposited in step a) has hydroxystyrene moieties and the material comprises a photoacid generator and a crosslinking compound.

10. The method of claim 1, wherein the organic polymer material in step c) is a block copolymer.

11. The method of claim 10, further comprising an annealing step after step a) and/or step c).

12. A product formed by the method of claim 1.

13. A device comprising the product of claim 12.

14. The device of claim 13, wherein the device is an LED display, organic electronic device, semiconductor device, bit patterned media device, solid state memory device, fuel cell membranes, solar cell, sensor, microelectromechanical system, or spin valve.

* * * * *